United States Patent
Wang et al.

(10) Patent No.: US 12,332,207 B2
(45) Date of Patent: Jun. 17, 2025

(54) $CuV_2O_6$-BASED PHOTOELECTRIC SENSOR AND APPLICATION THEREOF IN DETECTION OF ARGININE

(71) Applicant: INSTITUTE OF ANALYSIS, GUANGDONG ACADEMY OF SCIENCES (CHINA NATIONAL ANALYTICAL CENTER, GUANGZHOU), Guangzhou (CN)

(72) Inventors: Fuxian Wang, Guangzhou (CN); Boheng Dong, Guangzhou (CN); Liling Wei, Guangzhou (CN)

(73) Assignee: INSTITUTE OF ANALYSIS, GUANGDONG ACADEMY OF SCIENCES (CHINA NATIONAL ANALYTICAL CENTER, GUANGZHOU), Guangzhou (CN)

( * ) Notice: Subject to any disclaimer, the term of this patent is extended or adjusted under 35 U.S.C. 154(b) by 410 days.

(21) Appl. No.: 17/781,050

(22) PCT Filed: May 11, 2021

(86) PCT No.: PCT/CN2021/092922
§ 371 (c)(1),
(2) Date: May 31, 2022

(87) PCT Pub. No.: WO2022/068210
PCT Pub. Date: Apr. 7, 2022

(65) Prior Publication Data
US 2023/0003680 A1 Jan. 5, 2023

(30) Foreign Application Priority Data
Apr. 30, 2021 (CN) .......................... 202110481010.1

(51) Int. Cl.
*G01N 27/30* (2006.01)
*C23C 14/00* (2006.01)
(Continued)

(52) U.S. Cl.
CPC ....... *G01N 27/305* (2013.01); *C23C 14/0036* (2013.01); *C23C 14/08* (2013.01);
(Continued)

(58) Field of Classification Search
CPC ................ C23C 14/0036; C23C 14/08; C23C 14/352; C23C 14/5806; G01N 27/305; G01N 27/3275; G01N 27/36
(Continued)

(56) References Cited

FOREIGN PATENT DOCUMENTS

| CN | 105789603 A | 7/2016 |
| CN | 107607477 A | 1/2018 |

(Continued)

OTHER PUBLICATIONS

Zhou et al. "High Throughput Discovery of Solar Fuels Photoanodes in the CuO—V2O5 System", Advanced Energy Materials, 2015, 5, 1500968 (pp. 1-13) (Year: 2015).*

(Continued)

*Primary Examiner* — Rodney G McDonald
(74) *Attorney, Agent, or Firm* — Bayramoglu Law Offices LLC

(57) ABSTRACT

A $CuV_2O_6$-based photoelectric sensor is prepared through the following steps: acquiring a $CuV_2O_6$ thin film through a direct-current reactive magnetron co-sputtering method; and loading an 8-hydroxyquinoline solution on the $CuV_2O_6$ thin film through a spin-coating method to acquire an 8-hydroxyquinoline-modified $CuV_2O_6$ photoelectric sensor. The 8-hydroxyquinoline-modified $CuV_2O_6$ photoelectric sensor has a good anti-interference capability in the detection of arginine; it is easy to realize the low-cost mass production of $CuV_2O_6$ photoelectrodes through a developed direct-current reactive magnetron sputtering coating method; and a sensor device is low in cost, simple, portable, and easy to use, and has an application value in food safety and health and hygiene detection.

4 Claims, 8 Drawing Sheets

(51) Int. Cl.
  *C23C 14/08*  (2006.01)
  *C23C 14/35*  (2006.01)
  *C23C 14/58*  (2006.01)
  *G01N 27/327* (2006.01)
  *G01N 27/36*  (2006.01)

(52) U.S. Cl.
  CPC ........ *C23C 14/352* (2013.01); *C23C 14/5806* (2013.01); *G01N 27/3275* (2013.01); *G01N 27/36* (2013.01)

(58) Field of Classification Search
  USPC .................................................. 204/192.15
  See application file for complete search history.

(56) References Cited

FOREIGN PATENT DOCUMENTS

| CN | 110372035 A | 10/2019 |
| CN | 110426428 A | 11/2019 |
| CN | 111751414 A | 10/2020 |
| CN | 111830104 A | 10/2020 |

OTHER PUBLICATIONS

Rainer H. Böger, The Pharmacodynamics of L-Arginine 1-3, The Journal of Nutrition 6th Amino Acid Assessment Workshop, 2007, pp. 1650S-1655S, vol. 137.

Neelam Verma, et al., L-arginine biosensors: A comprehensive review, Biochemistry and Biophysics Reports, 2017, pp. 228-239, vol. 12.

C.A. Uthurry, et al., Ethyl carbamate production by selected yeasts and lactic acid bacteria in red wine, Food Chemistry, 2006, pp. 262-270, vol. 94.

C. S. Ough, et al., Preliminary Comments on Effects of Grape Vineyard Nitrogen Fertilization on the Subsequent Ethyl Carbamate Formation in Wines, Am. J. Enol. Vitic., 1989, pp. 219-220, vol. 40, No. 3.

O.Y. Saiapina, et al., Development and optimization of a novel conductometric bi-enzyme biosensor for L-arginine determination, Talanta, 2012, pp. 58-64, vol. 92.

Jian Shu, et al., Recent Advances in Photoelectrochemical Sensing: From Engineered Photoactive Materials to Sensing Devices and Detection Modes, Analytical Chemistry, 2019, pp. 1-19.

Gang He, et al., A Quinoliene-Containing Conjugated Polymer-Based Sensing Platform for Amino Acids, pp. 349.

B. Jansi Rani, et al., Photoelectrochemical activity of copper vanadate nanostructures, Materials Letters, 2020, pp. 1-4, vol. 274, 127996.

* cited by examiner

$CuV_2O_6$-BASED PHOTOELECTRIC SENSOR AND APPLICATION THEREOF IN DETECTION OF ARGININE

CROSS REFERENCE TO THE RELATED APPLICATIONS

This application is the national phase entry of International Application No. PCT/CN2021/092922, filed on May 11, 2021, which is based upon and claims priority to Chinese Patent Application No. 202110481010.1, filed on Apr. 30, 2021, the entire contents of which are incorporated herein by reference.

TECHNICAL FIELD

The present invention relates to the field of photoelectrochemical sensing technologies, and in particular, to a $CuV_2O_6$-based photoelectric sensor and application thereof in detection of arginine.

BACKGROUND

Arginine is an amino acid which is of great detection significance in clinical medicine. An appropriate amount of arginine may be converted to nitric oxide by nitric oxide synthase to enhance vasodilation and assist in treating various physiological diseases, such as cardiovascular disease, peripheral vascular disease, erectile dysfunction, atherosclerosis, vascular headache and chest pain [RH Boger, The pharmacodynamics of L-Arginine [J]. Nutr, 2007, 137 (6):1650S-1655S.]. It has been confirmed that the abnormal concentration of arginine is related to tumors. In different types of cancer, the concentration of plasma arginine is generally lower than a normal level. For example, the concentration of arginine is 80±3 μM in breast cancer and colon cancer, 76±5 μM in pancreatic cancer, 41.9±13.4 μM in esophageal cancer, but 90-150 μM at the normal level [N Verma, et al. L-arginine biosensors: A comprehensive review[J].BB Reports,2017,12: 228-239.]. Therefore, arginine may be used as a tumor biomarker.

In terms of food safety, especially for fermented juice and wine, the content of arginine affects the quality of food. In a biological fermentation process of a winery, if the content of arginine in grape juice used for winemaking is too high, a large amount of urea accumulates and spontaneously reacts with ethanol to form ethyl carbamate (a carcinogen), resulting in food safety problems [CA Uthurry, et al. Ethyl carbamate production by selected yeasts and lactic acid bacteria in red wine [J]. Food Chem, 2006, 94:262-270.]. It is reported that if the content of arginine in the grape juice exceeds 1000 mg/L, the potential content of ethyl carbamate in the brewed wine may exceed the limit value (15 μg/L). Therefore, it is necessary to detect arginine [CS Ough, et al. Preliminary comments on effects of grape vineyard nitrogen fertilization Oil the subsequent ethyl carbamate formation in wines [J]. Am. J. En01. Vitic, 1989, 40(3):219-220.].

Traditional quantitative arginine detection methods include spectrophotometry, capillary electrophoresis, ion exchange chromatography, liquid chromatography, gas chromatography, and the like [O.Y. Saiapina a b, et al. Development and optimization of a novel conductometric bi-enzyme biosensor for 1-arginine determinations[J]. Talanta, 2012,92:8-64.]. All these methods are relatively time-consuming and require expensive instruments. As a novel detection technology, photoelectrochemical detection has received wide attention in recent years due to its advantages, such as high signal intensity, low cost, simplicity, high portability, and ease of large-scale mass production.

Photoelectrochemical detection combines the advantages of traditional electrochemical detection and optical detection, on the one hand, inherits the advantage of a simple device of the electrochemical detection, and on the other hand, achieves high sensitivity as a background signal is extremely low due to complete isolation of an excitation source (light) and a detection signal (electrical).

Among various photocatalytic materials used in photoelectrochemical bioanalysis, semiconductor metal oxides have attracted much attention due to their low cost and high photocatalytic activity. Photocatalytic materials, such as $TiO_2$, ZnO, $SnO_2$ and $WO_3$ have been used in photoelectrochemical sensors, but need to be driven by an ultraviolet light source due to their wider band gap and low visible light response. CuO (1.2-1.7e V) with a narrower band gap shows great development potential when being used, as a photosensitive material, for visible light-driven photoelectric sensors. However, CuO and other CuO-based multi-element oxides ($CuBi_2O_4$, $CuFeO_2$, $CuAlO_2$) suffer severe photocorrosion in a test environment, which greatly limits their application in photoelectrochemical sensors. This problem needs to be solved urgently.

SUMMARY

To solve the problems in the prior art, the present invention proposes a $CuV_2O_6$-based photoelectric sensor and application thereof in detection of arginine. A direct-current reactive magnetron co-sputtering process proposed in the present invention is simple, easy to implement and cost-effective, $CuV_2O_6$ (equivalent to $Cu_{1-x}V_xO_z$, x=0.666) for visible light-driven photoelectrochemical sensing is prepared through this process, the surface of $CuV_2O_6$ is modified with 8-hydroxyquinoline, and thus a photoelectrochemical sensor for detecting arginine is prepared. Compared with a CuO sensor, this sensor has significantly enhanced stability, and thus can accurately and efficiently detect arginine.

An object of the present invention is to provide a $CuV_2O_6$-based photoelectric sensor. The $CuV_2O_6$-based photoelectric sensor is prepared through the following steps: acquiring a $CuV_2O_6$ thin film through a direct-current reactive magnetron co-sputtering method; and loading an 8-hydroxyquinoline solution on the $CuV_2O_6$ thin film through a spin-coating method to acquire an 8-hydroxyquinoline-modified $CuV_2O_6$ photoelectric sensor.

Preferably, the $CuV_2O_6$-based photoelectric sensor is specifically prepared through the following steps: starting pre-sputtering through the direct-current reactive magnetron co-sputtering method after a target and a substrate are installed on a magnetron sputtering instrument, a chamber atmosphere and pressure of the magnetron sputtering instrument are controlled, and power of the target and a temperature of the substrate are set; opening a substrate baffle to start deposition after glow stabilizes; taking out a sample after deposition is ended; calcining the sample in an air atmosphere to acquire the $CuV_2O_6$; placing the acquired $CuV_2O_6$ thin film on a spin coater; and loading the 8-hydroxyquinoline solution on the $CuV_2O_6$ thin film through the spin-coating method to acquire the 8-hydroxyquinoline-modified $CuV_2O_6$ photoelectric sensor.

Further preferably, the target includes metal Cu and metal V, a sputtering power source is a direct-current power source, the chamber atmosphere of the magnetron sputtering instrument is a mixture of argon and oxygen, a sputtering mode is co-sputtering of Cu and V, and the substrate is Fluorine-doped Tin Oxide (FTO) glass.

Further preferably, the power of the metal Cu is 10-50 W, the power of the metal V is 100-500 W, pre-sputtering pressure is 0.5-2.5 Pa, the temperature of the substrate is 100-400° C., a rotating speed of a substrate holder is 5-30 r/min, a pre-sputtering time is 300-1,200 s, a deposition time is 1,000-6,000 s, a calcination temperature is 200-550° C., and a calcination time is 0.5-2 h.

Preferably, the 8-hydroxyquinoline solution is prepared through the following steps: dissolving 8-hydroxyquinoline in ethanol to prepare a solution with the concentration of 100-1,400 mmol/L, and mixing the prepared solution with Nafion with a mass fraction of 1-10% according to the volume ratio of 9:1 to acquire the 8-hydroxyquinoline solution.

Further preferably, a dropping amount of the 8-hydroxyquinoline solution is 10-40 and the spin coater rotates at the rotating speed of 500-2,000 r/min for 9-40 s.

The present invention further claims application of the above $CuV_2O_6$-based photoelectric sensor in detection of arginine. For the use of the $CuV_2O_6$-based photoelectric sensor according to the present invention, the sensor has an obvious response to the detection of arginine, but no obvious response to other amino acids.

Preferably, the application specifically includes the following steps: immersing the photoelectric sensor in borate buffered saline (BBS, pH=9) containing arginine of different concentrations for incubation and then taking out the photoelectric sensor; testing an electrode photocurrent of the sensor with a three-electrode system; drawing a fitting working curve of photocurrent density and the concentration of arginine; and detecting arginine in a sample to be tested with a standard addition method.

A base-10 logarithm of the photocurrent density of the sensor has a good linear relationship with the concentration of arginine ($1.0 \times 10^{-5}$-$1.0 \times 10^{-3}$ mol/L).

In the present invention, the photoelectrochemical sensor for detecting arginine is prepared for the first time and thus the arginine can be detected accurately and efficiently. The sensor shows good photoelectrochemical response characteristics to arginine, and the base-10 logarithm of the photocurrent density has the good linear relationship with the concentration of arginine, thereby greatly improving the signal strength of a traditional electrochemical method. It is easy to realize low-cost and large-scale production of $CuV_2O_6$ photoelectrodes through a developed direct-current reactive magnetron co-sputtering coating method; and the sensor device is low in cost, simple, portable, and easy to use, and has an application value in food safety and health and hygiene detection.

Further preferably, an incubation time is 10-120 min.

Further preferably, the electrode photocurrent of the sensor is tested with the three-electrode system under the voltage of 0.9-1.6V vs RHE.

Compared with the prior art, the present invention has the following advantages.

1. In the present invention, the $CuV_2O_6$ thin film is prepared by innovatively using the direct-current reactive magnetron co-sputtering method, and 8-hydroxyquinoline is loaded on the $CuV_2O_6$ thin film through the spin-coating method to acquire the 8-hydroxyquinoline-modified $CuV_2O_6$ photoelectric sensor which has a specific reaction with arginine.

2. After the 8-hydroxyquinoline-modified $CuV_2O_6$ photoelectric sensor is incubated in an arginine solution, 8-hydroxyquinoline and arginine are specifically combined, so that arginine is immobilized on a surface of a photoelectrode. During a photoelectrochemical test, different photocurrents are displayed as the amounts of arginine immobilized on the surface of the photoelectrode are different and the concentration of arginine can be determined according to the magnitude of the photocurrent, thereby achieving the purpose of detection.

3. The 8-hydroxyquinoline-modified $CuV_2O_6$ photoelectric sensor has an obvious response to arginine in a concentration detection experiment of common amino acids, but no obvious response to other amino acids, which indicates that the 8-hydroxyquinoline-modified $CuV_2O_6$ photoelectric sensor has a good anti-interference capability in detection of arginine.

4. The 8-hydroxyquinoline-modified $CuV_2O_6$ photoelectric sensor has significantly enhanced stability compared to the CuO sensor, and thus can accurately and efficiently detect arginine, greatly improves the signal strength of the traditional electrochemical method. It is easy to realize the low-cost large-scale production of $CuV_2O_6$ photoelectrodes through the developed direct-current reactive magnetron co-sputtering coating method; and the photoelectric sensor device is low in cost, simple, portable, and easy to use, and has an application value in food safety and health and hygiene detection.

DETAILED DESCRIPTION

The technical solutions of the present invention will be clearly and completely described below with reference to the embodiments of the present invention. Obviously, the embodiments described are merely some but not all embodiments of the present invention. Based on the embodiments of the present invention, all other embodiments derived by a person of ordinary skill in the art without creative efforts shall fall within the protection scope of the present invention. Unless otherwise specified, devices and reagents used in the present invention are conventional commercially available products in the art. In the following embodiments, the used reagents all were analytical reagents and water used in tests was ultrapure water (conductivity ≤0.4 μc/cm$^2$).

Figure 1:
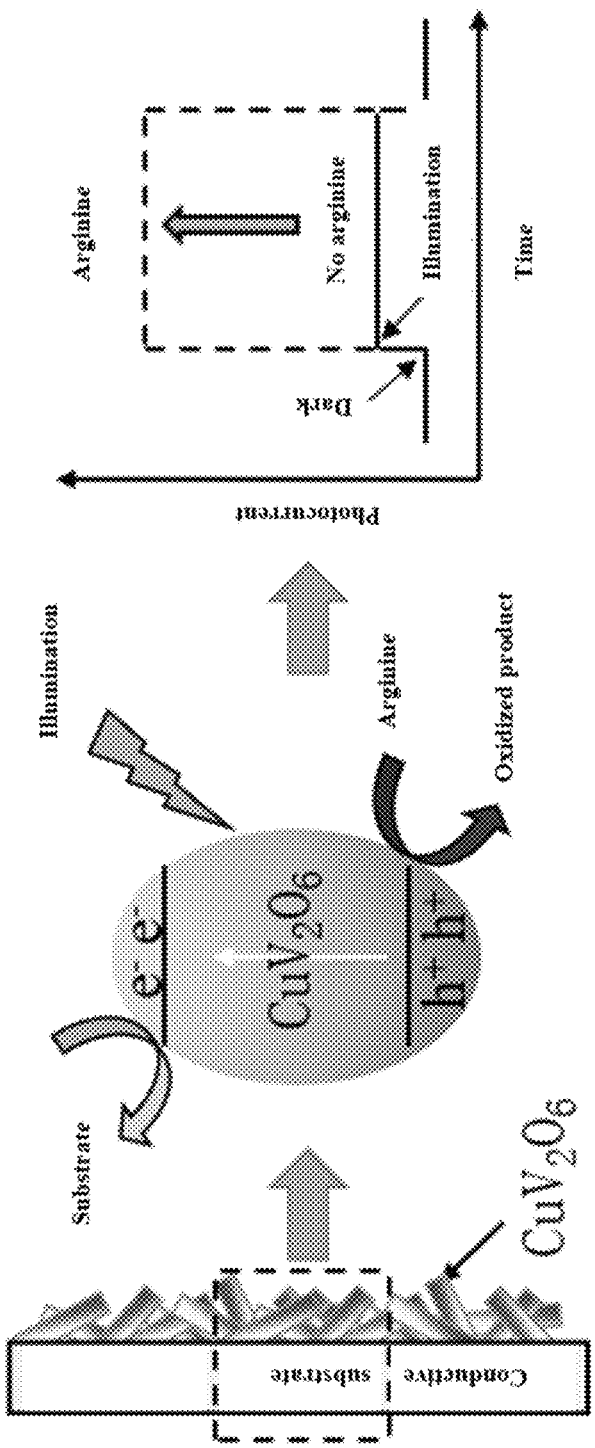
FIG. 1 is a schematic diagram of a mechanism of an 8-hydroxyquinoline-modified $CuV_2O_6$ photoelectric sensor according to the present invention.

As shown in FIG. 1, the present invention provides a $CuV_2O_6$-based photoelectric sensor. The $CuV_2O_6$-based photoelectric sensor is prepared through the following steps: a $CuV_2O_6$ thin film is acquired through a direct-current reactive magnetron co-sputtering method; and an 8-hydroxyquinoline solution is loaded on the $CuV_2O_6$ thin film through a spin-coating method to acquire an 8-hydroxyquinoline-modified $CuV_2O_6$ photoelectric sensor.

Specific implementation steps are as follows.

Pre-sputtering is started through the direct-current reactive magnetron co-sputtering method after a target and a substrate are installed on a magnetron sputtering instrument, a chamber atmosphere and pressure of the magnetron sputtering instrument are controlled, and the power of the target and the temperature of the substrate are set; a substrate baffle is opened to start deposition after glow stabilizes; and a sample is taken out after deposition is ended and calcined in an air atmosphere to acquire the $CuV_2O_6$ thin film. The acquired $CuV_2O_6$ thin film is placed on a spin coater; and the 8-hydroxyquinoline solution is loaded on the $CuV_2O_6$ thin film through the spin-coating method to acquire the 8-hydroxyquinoline-modified $CuV_2O_6$ photoelectric sensor.

In the following embodiment, preferably, the target includes metal Cu and metal V, a sputtering power source is a direct-current power source, the chamber atmosphere of the magnetron sputtering instrument is a mixture of argon and oxygen, a sputtering mode is co-sputtering of Cu and V, and the substrate is FTO glass. Further preferably, the power of the metal Cu is 10-50 W, the power of the metal V is 100-500 W, pre-sputtering pressure is 0.5-2.5 Pa, the temperature of the substrate is 100-400° C., a rotating speed of a substrate holder is 5-30 r/min, a pre-sputtering time is 300-1,200 s, a deposition time is 1,000-6,000 s, a calcination temperature is 200-550° C., and a calcination time is 0.5-2 h.

In the following embodiment, the 8-hydroxyquinoline solution is prepared through the following steps: 8-hydroxyquinoline is dissolved in ethanol to prepare a solution with the concentration of 100-1,400 mmol/L, and this solution is mixed with Nafion with the mass fraction of 1-10% according to the volume ratio of 9:1 to acquire the 8-hydroxyquinoline solution.

In the following embodiment, the 8-hydroxyquinoline solution is loaded on the $CuV_2O_6$ thin film at a dropping amount of 10-40 μL through the spin-coating method, and the spin coater rotates at the rotating speed of 500-2,000 r/min for 9-40 s.

For the use of the $CuV_2O_6$-based photoelectric sensor according to the present invention, the photoelectric sensor has an obvious response to the detection of arginine, but no obvious response to other amino acids.

For the application of sensor, the following steps are specifically included: the photoelectric sensor is immersed in borate buffered saline (BBS, pH=9) containing arginine of different concentrations for incubation and then the photoelectric sensor is taken out. An electrode photocurrent of the sensor is tested with a three-electrode system. A fitting working curve of photocurrent density and the concentration of arginine is drawn. Arginine in a sample to be tested is detected with a standard addition method.

In the following embodiment, preferably, the photoelectric sensor is immersed in the borate buffered saline for incubation for 10-120 min. The electrode photocurrent of the sensor is tested with the three-electrode system under the voltage of 0.9-1.6V vs RHE.

In the present invention, the photoelectrochemical sensor for detecting arginine is prepared for the first time and thus the arginine can be detected accurately and efficiently. The sensor shows good photoelectrochemical response characteristics to arginine, and the base-10 logarithm of the photocurrent density has a good linear relationship with the concentration of arginine, thereby greatly improving the signal strength of a traditional electrochemical method.

Embodiment 1

A $CuV_2O_6$-based photoelectric sensor is prepared through the following steps.

(1) Pre-sputtering is started for 600 s through a direct-current reactive magnetron co-sputtering method after a target metal Cu and a target metal V are installed on a magnetron sputtering instrument, wherein a substrate is FTO glass, a sputtering mode is co-sputtering of Cu and V, a chamber atmosphere of the magnetron sputtering instrument is a mixture of argon and oxygen, and the following parameters are set: the power of the target Cu is 15 W, the power of the target V is 350W, the sputtering pressure is 1.2 Pa, the temperature of the substrate is 200° C., and the rotating speed of a substrate holder is 20 r/min. After glow stabilizes, a substrate baffle is opened to start deposition for 2,700 s. A sample is taken out after the deposition is ended and calcined at 450° C. for 1 h in an air atmosphere to acquire a $CuV_2O_6$ thin film.

(2) A 200 mmol/L 8-hydroxyquinoline-ethanol solution is mixed with Nafion with the mass fraction of 5% according to the volume ratio of 9:1 to acquire an 8-hydroxyquinoline solution. 20 μL of the prepared 8-hydroxyquinoline solution is loaded on the $CuV_2O_6$ thin film acquired in step (1) through a spin-coating method to acquire the 8-hydroxyquinoline-modified $CuV_2O_6$ photoelectric sensor, wherein a spin coater rotates at the rotating speed of 1,000 r/min for 18 s.

Figure 2:
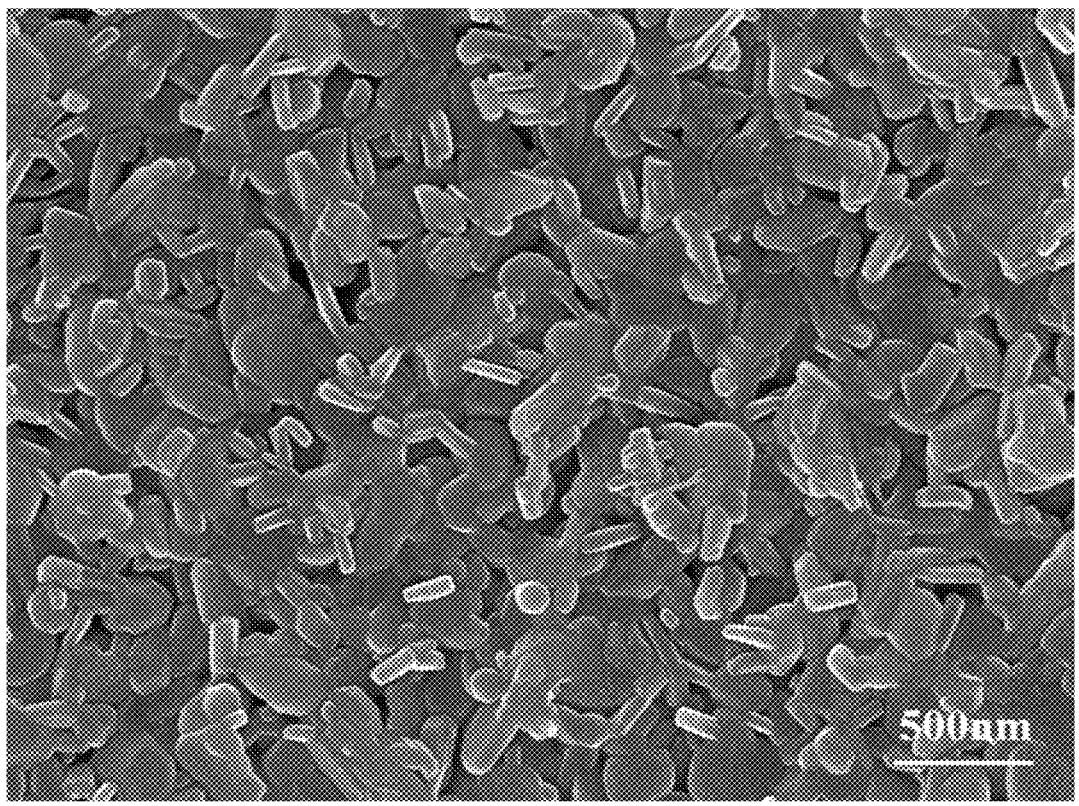
FIG. 2 is a scanning electron microscope (SEM) image of a $CuV_2O_6$ thin film prepared according to Embodiment 1.
Figure 3:
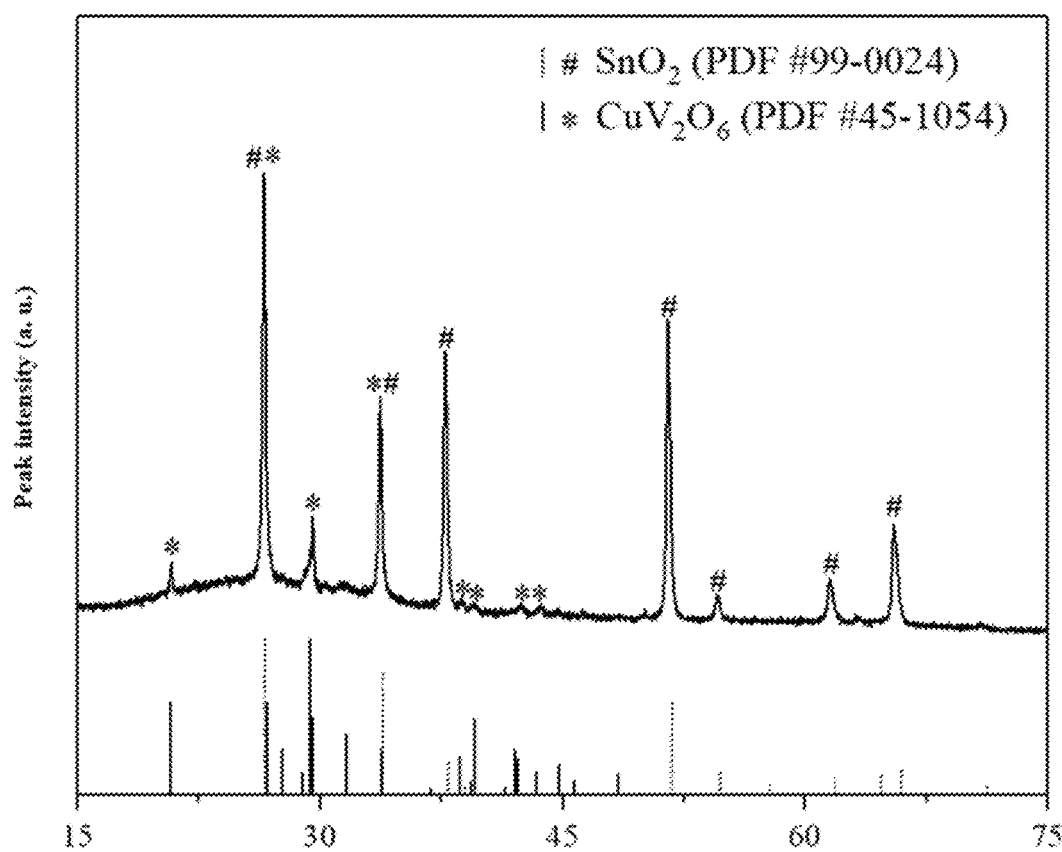
FIG. 3 is an X-ray diffraction (XRD) pattern of the $CuV_2O_6$ thin film prepared according to Embodiment 1.

The surface morphology features and structure of the $CuV_2O_6$ thin film acquired in step (1) were analyzed through a scanning electron microscope (SEM) and an X-ray diffractometer (XRD). As shown in FIG. 2 and FIG. 3, it can be obviously seen from an SEM image of FIG. 2 that the prepared $CuV_2O_6$ was formed by densely packing linear particles. An XRD pattern of FIG. 3 showed that in addition to diffraction peaks ($SnO_2$) of the FTO substrate, diffraction peaks of $CuV_2O_6$ may be clearly found.

The 8-hydroxyquinoline-modified $CuV_2O_6$ photoelectric sensor acquired in step (2) was immersed in 0.1 mmol/L arginine-borate buffered saline (BBS, pH=9) for incubation for 10 minutes, then taken out, and rinsed with the borate buffered saline for three times.

Figure 4:
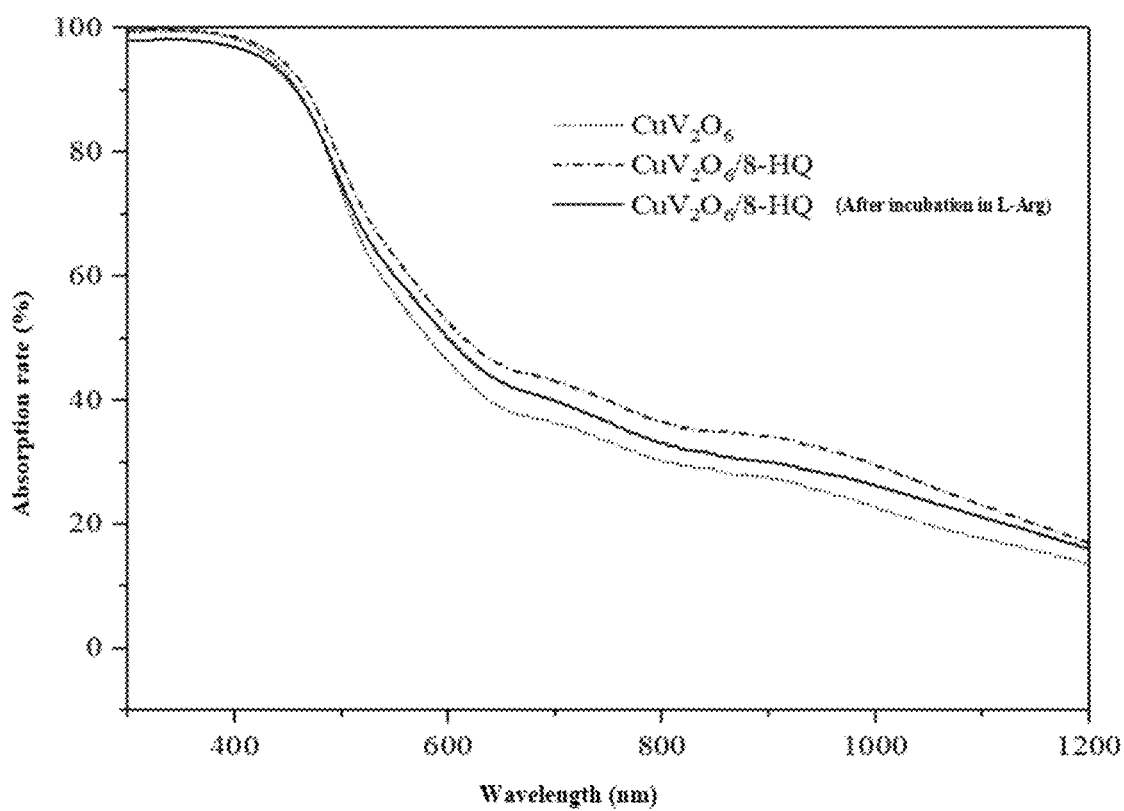
FIG. 4 shows visible-light absorption spectrograms of a $CuV_2O_6$ thin film, a 8-hydroxyquinoline-modified $CuV_2O_6$ photoelectric sensor prepared according to Embodiment 1, and the 8-hydroxyquinoline-modified $CuV_2O_6$ photoelectric sensor prepared according to Embodiment 1 after incubation in arginine.

The absorbance of the $CuV_2O_6$ thin film acquired in step (1), the absorbance of the 8-hydroxyquinoline-modified $CuV_2O_6$ photoelectric sensor acquired in step (2), and the absorbance of the 8-hydroxyquine-modified $CuV_2O_6$ photoelectric sensor acquired in step (2) after incubation in arginine were tested respectively with an ultraviolet-visible-near-infrared spectrophotometer (FIG. 4). It can be seen from FIG. 4 that the 8-hydroxyquinoline-modified $CuV_2O_6$ photoelectric sensor absorbed visible light after being incubated in an arginine solution, and the absorbance did not change greatly after the $CuV_2O_6$ thin film was loaded with 8-hydroxyquinoline and the sensor was incubated in the arginine solution.

Figure 5:
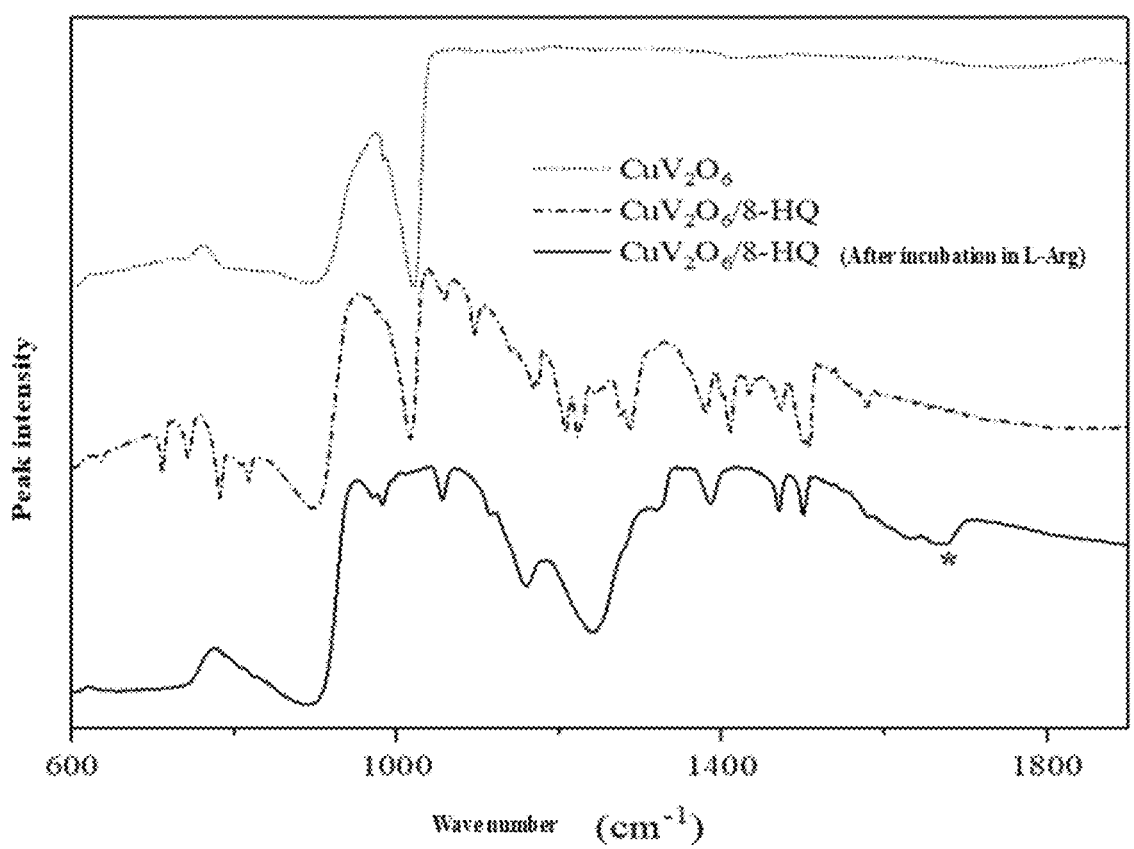
FIG. 5 shows infrared spectrograms of a $CuV_2O_6$ thin film, a 8-hydroxyquinoline-modified $CuV_2O_6$ photoelectric sensor, and the 8-hydroxyquinoline-modified $CuV_2O_6$ photoelectric sensor after incubation in arginine.

Infrared spectrograms of the $CuV_2O_6$ thin film acquired in step (1), the 8-hydroxyquinoline-modified $CuV_2O_6$ photoelectric sensor acquired in step (2), and the 8-hydroxyquine-modified $CuV_2O_6$ photoelectric sensor acquired in step (2) after incubation in arginine were tested with an infrared analyzer (FIG. 5). It can be seen from FIG. 5 that extra peaks of the 8-hydroxyquinoline-modified $CuV_2O_6$ photoelectric sensor compared with the $CuV_2O_6$ thin film corresponded to infrared spectrum peaks of 8-hydroxyquinoline, which indicated that 8-hydroxyquinoline was effectively loaded on the surface of the $CuV_2O_6$ photoelectric sensor. After the 8-hydroxyquinoline-modified $CuV_2O_6$ photoelectric sensor was incubated in arginine, the infrared spectrum of the 8-hydroxyquinoline-modified $CuV_2O_6$ photoelectric sensor showed an extra peak obviously at the position of 1680 $cm^{-1}$, and this peak may be assigned to a —$NH_2$ group of arginine.

Experimental Example 1

The 8-hydroxyquinoline-modified $CuV_2O_6$ photoelectric sensor prepared in Embodiment 1 was immersed in borate buffered saline (BBS, pH=9) containing arginine of different concentrations, i.e., 10 μmol/L, 20 μmol/L, 40 μmol/L, 100 μmol/L, 200 μmol/L, 400 μmol/L, 1,000 μmol/L, respectively for incubation for 10 min, then taken out and rinsed with borate buffered saline for three times. A photocurrent of the sensor was tested with a three-electrode system, a fitting working curve of the photocurrent density and the concentration of arginine was drawn, and then arginine in the sample to be tested was detected with a standard addition method.

1. Stability of 8-Hydroxyquinoline-Modified $CuV_2O_6$ Photoelectric Sensor

Figure 6:
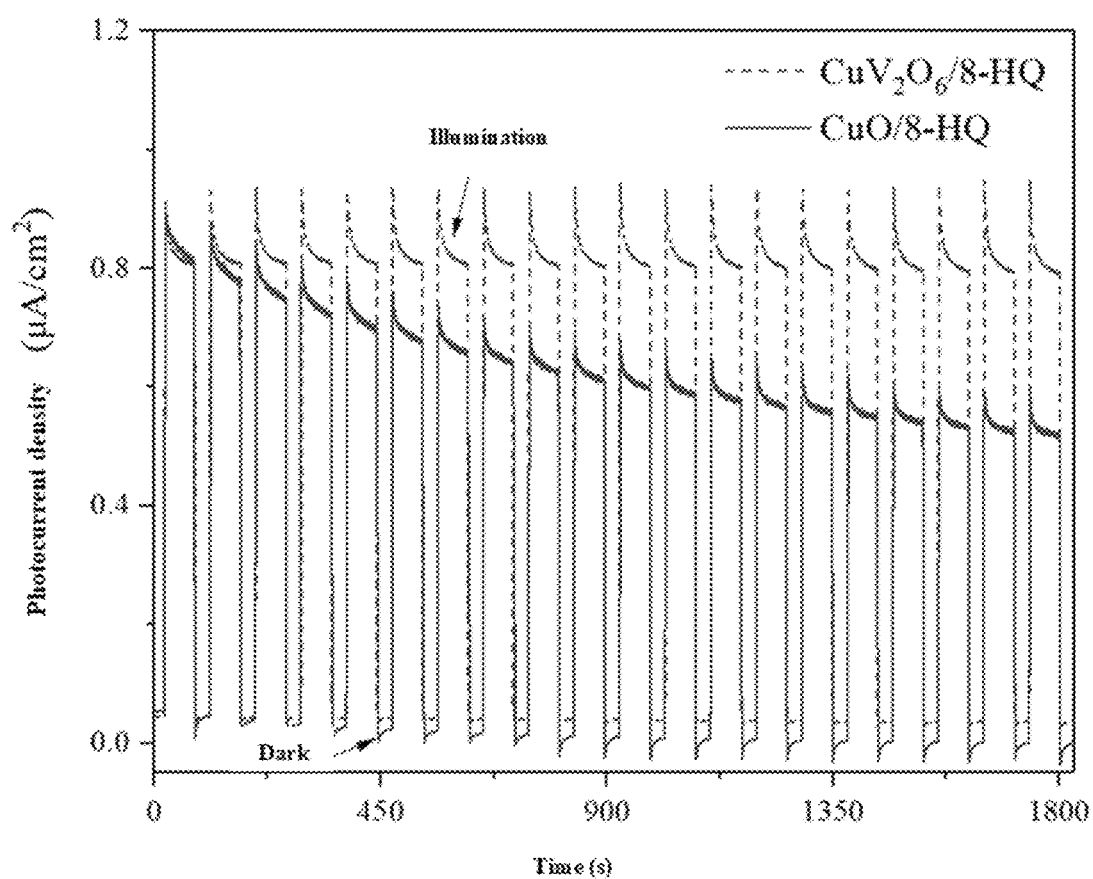
FIG. 6 is a comparison diagram of photocurrent stability of an 8-hydroxyquinoline-modified $CuV_2O_6$ photoelectric sensor and an 8-hydroxyquinoline-modified CuO photoelectric sensor.

Photocurrents of the 8-hydroxyquinoline-modified $CuV_2O_6$ photoelectric sensor and an 8-hydroxyquinoline-modified CuO photoelectric sensor were tested for 30 min with the three-electrode system (as shown in FIG. 6, the initial photocurrent density was 0.85 $mA/cm^2$). The photocurrent of the 8-hydroxyquinoline-modified $CuV_2O_6$ photoelectric sensor has remained unchanged all the time, whereas the photocurrent of the CuO photoelectric sensor attenuated rapidly with time, which indicated that the 8-hydroxyquinoline-modified $CuV_2O_6$ photoelectric sensor was more stable than the CuO photoelectric sensor during a photoelectrochemical test.

Figure 7:
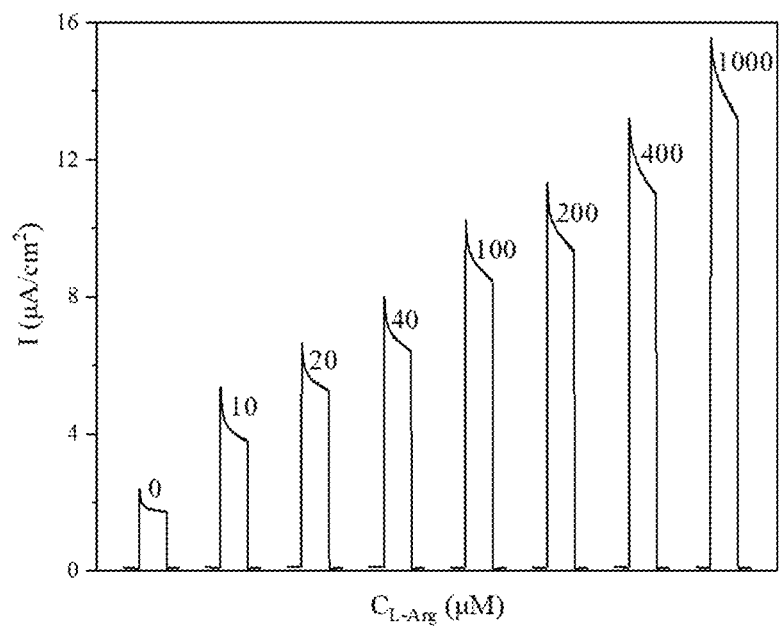
FIG. 7 is a diagram of a photoelectric signal detected after an 8-hydroxyquinoline-modified $CuV_2O_6$ photoelectric sensor is incubated in borate buffered saline containing arginine of different concentrations.

2. Test of Concentration of Arginine Through 8-Hydroxyquinoline-Modified $CuV_2O_6$ Photoelectric Sensor After the 8-hydroxyquinoline-modified $CuV_2O_6$ photoelectric sensor was incubated in an arginine solution, 8-hydroxyquinoline and arginine were specifically combined, so that arginine was immobilized on a surface of a photoelectrode. As the amounts of arginine immobilized on the surface of the photoelectrode were different when the 8-hydroxyquinoline-modified $CuV_2O_6$ photoelectric sensor was incubated in arginine of different concentrations, different photocurrents were displayed (as shown in FIG. 7). The concentration of arginine may be determined according to the magnitude of the photocurrent, thereby achieving the purpose of detection.

Figure 8:
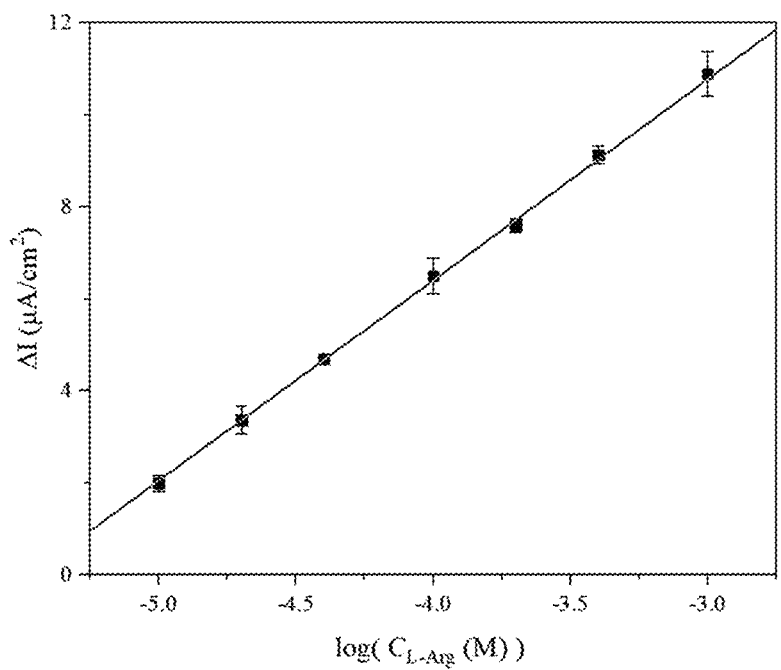
FIG. 8 is a diagram showing a linear relationship between a base-10 logarithm of photocurrent density and the concentration of arginine after an 8-hydroxyquinoline-modified $CuV_2O_6$ photoelectric sensor is incubated in arginine of different concentrations.

Under optimized experimental conditions, after being immersed in borate buffered saline (BBS, pH=9) containing arginine of different concentrations, the 8-hydroxyquinoline-modified $CuV_2O_6$ photoelectric sensor was subjected to a photochemical test. As shown in FIG. 7 and FIG. 8, the photocurrent density increased steadily in the process during which the concentration of arginine increased from $1.0*10^{-5}$ mol/L to $1.0*10^{-3}$ mol/L. After fitting, a functional relationship between the concentration of arginine and the photocurrent density was as follows:

$$\Delta I = a + b \times \log_{10} C_{L-ARg},$$

where $a=23.85703\pm0.27555$, $b=4.36164\pm0.0637$, $R^2=99.893\%$, which indicated that the fitting degree was good.

Figure 9:
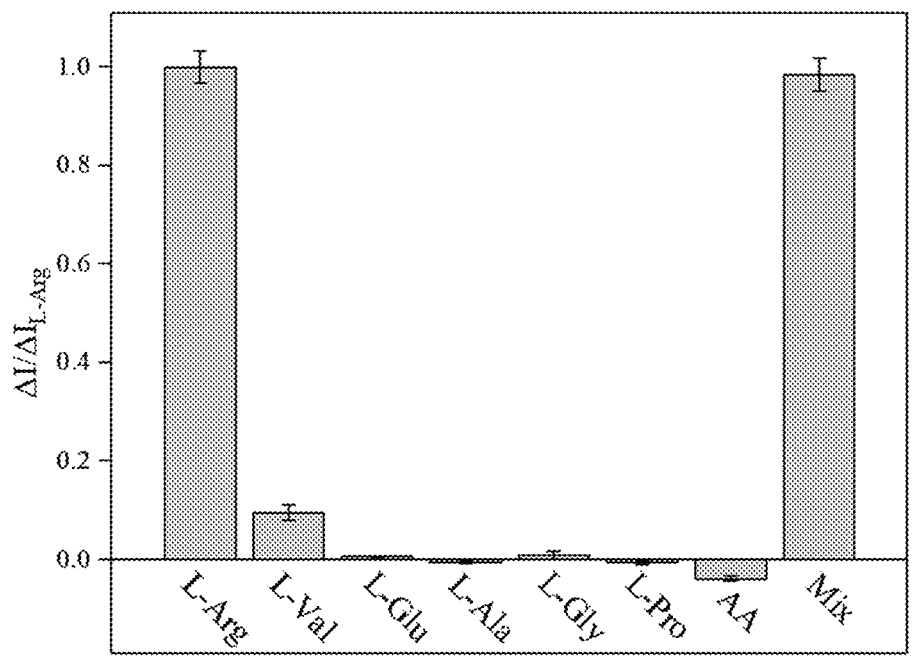
FIG. 9 is a diagram showing response of a photoelectric signal of an 8-hydroxyquinoline-modified $CuV_2O_6$ photoelectric sensor to different amino acids.

3. ANTI-Interference Test of 8-Hydroxyquinoline-Modified $CuV_2O_6$ Photoelectric Sensor In the three-electrode system of borate buffered saline (BBS, pH=9), the detection of common amino acids by the 8-hydroxyquinoline-modified $CuV_2O_6$ photoelectric sensor was investigated. In the detection of L-arginine (L-Arg), L-valine (L-Val), L-glutamine (L-Glu), L-alanine (L-Ala), L-glycine (L-Gly), L-proline (L-Pro), and ascorbic acid (AA), all of which the concentrations were 100 μmol/L, and a mixed sample (including all the amino acids mentioned above), as shown in FIG. 9, the sensor had an obvious response to L-arginine, but no obvious response to the other amino acids. In addition, a value of response of the sensor to the mixed sample was also close to a value of response to L-arginine, which indicated that the 8-hydroxyquinoline-modified $CuV_2O_6$ photoelectric sensor had a good anti-interference capability in the detection of arginine.

Embodiment 2

A $CuV_2O_6$-based photoelectric sensor is prepared through the following steps.

(1) Pre-sputtering is started for 300 s through a direct-current reactive magnetron co-sputtering method after a target metal Cu and a target metal V are installed on a magnetron sputtering instrument, wherein a substrate is FTO glass, a sputtering mode is co-sputtering of Cu and V, a chamber atmosphere of the magnetron sputtering instrument is a mixture of argon and oxygen, and the following parameters are set: the power of the target Cu is 10 W, the power of the target V is 100 W, the sputtering pressure is 0.5 Pa, the temperature of the substrate is 200° C., and the rotating speed of a substrate holder is 5 r/min. After glow stabilizes, a substrate baffle is opened to start deposition for 6,000 s. A sample is taken out after the deposition is ended and calcined at 200° C. for 2 h in an air atmosphere to acquire a $CuV_2O_6$ thin film.

(2) A 100 mmol/L 8-hydroxyquinoline-ethanol solution is mixed with Nafion with the mass fraction of 5% according to the volume ratio of 9:1 to acquire an 8-hydroxyquinoline solution. 40 μL of the prepared 8-hydroxyquinoline solution is loaded on the $CuV_2O_6$ thin film acquired in step (1) through a spin-coating method to acquire the 8-hydroxyquinoline-modified $CuV_2O_6$ photoelectric sensor, wherein a spin coater rotates at the rotating speed of 500 r/min for 40 s.

Embodiment 3

A $CuV_2O_6$-based photoelectric sensor is prepared through the following steps.

(1) Pre-sputtering is started for 1,200 s through a direct-current reactive magnetron co-sputtering method after a target metal Cu and a target metal V are installed on a magnetron sputtering instrument, wherein a substrate is FTO glass, a sputtering mode is co-sputtering of Cu and V, a chamber atmosphere of the magnetron sputtering instrument is a mixture of argon and oxygen, and the following parameters are set: the power of the target Cu is 50 W, the power of the target V is 500 W, the sputtering pressure is 2.5 Pa, the temperature of the substrate is 400° C., and the rotating speed of a substrate holder is 30 r/min. After glow stabilizes, a substrate baffle is opened to start deposition for 1,000 s. A sample is taken out after the deposition is ended and calcined at 550° C. for 0.5 h in an air atmosphere to acquire a $CuV_2O_6$ thin film.

(2) A 1,400 mmol/L 8-hydroxyquinoline-ethanol solution is mixed with Nafion with the mass fraction of 5% according to the volume ratio of 9:1 to acquire an 8-hydroxyquinoline solution. 10 μL of the prepared 8-hydroxyquinoline solution is loaded on the $CuV_2O_6$ thin film acquired in step (1) through a spin-coating method to acquire the 8-hydroxyquinoline-modified $CuV_2O_6$ photoelectric sensor, wherein a spin coater rotates at the rotating speed of 2,000 r/min for 9 s.

The photoelectric sensors prepared in Embodiments 1-3 were immersed in borate buffered saline (BBS, pH=9) containing arginine of different concentrations, i.e., 10 μmol/L, 20 μmol/L, 40 μmol/L, 100 μmol/L, 200 μmol/L, 400 μmol/L, 1,000 μmol/L, respectively for incubation for 120 min, and then taken out. Electrode photocurrents of the sensors were tested with a three-electrode system, fitting working curves of the photocurrent densities and the concentrations of arginine were drawn, and then arginine in the samples to be tested were detected with a standard addition method.

The electrode photocurrent of the sensor was tested with the three-electrode system under the voltage of 1.2 V vs RHE.

The above description of the embodiments is only used to help understanding the technical solutions and core concept of the present invention. It should be noted that those skilled in the art can make some improvements and modifications to the present invention without departing from the principles of the present invention, and these improvements and modifications shall fall within the protection scope of the present invention.

What is claimed is:

1. A $CuV_2O_6$-based photoelectric sensor, wherein the $CuV_2O_6$-based photoelectric sensor is prepared by a method comprising the following steps:

1) acquiring a $CuV_2O_6$ thin film through a direct-current reactive magnetron co-sputtering method; and
2) loading an 8-hydroxyquinoline solution on the $CuV_2O_6$ thin film through a spin-coating method to acquire an 8-hydroxyquinoline-modified $CuV_2O_6$ photoelectric sensor.

2. The $CuV_2O_6$-based photoelectric sensor according to claim 1, wherein step 1 comprises:
installing a target and a substrate on a magnetron sputtering instrument;
starting pre-sputtering through the direct-current reactive magnetron co-sputtering method, wherein a chamber atmosphere and pressure of the magnetron sputtering instrument are controlled, and power of the target and a temperature of the substrate are set;
opening a substrate baffle to start deposition after glow stabilizes;
taking out a sample after the deposition is ended;
calcining the sample in an air atmosphere to acquire the $CuV_2O_6$ thin film; and step 2 comprises:
placing the $CuV_2O_6$ thin film on a spin coater; and
loading the 8-hydroxyquinoline solution on the $CuV_2O_6$ thin film through the spin-coating method to acquire the 8-hydroxyquinoline-modified $CuV_2O_6$ photoelectric sensor.

3. The $CuV_2O_6$-based photoelectric sensor according to claim 2, wherein the target comprises metal Cu and metal V,
the power of the target is a direct-current power source,
the chamber atmosphere of the magnetron sputtering instrument is a mixture of argon and oxygen,
a sputtering mode is co-sputtering of the metal Cu and the metal V, and
the substrate is Fluorine-doped Tin Oxide (FTO) glass.

4. The $CuV_2O_6$-based photoelectric sensor according to claim 3, wherein a power of the metal Cu is 10-50 W, a power of the metal V is 100-500 W,
pre-sputtering pressure is 0.5-2.5 Pa,
the temperature of the substrate is 100-400° C.,
a rotating speed of the substrate is 5-30 r/min,
a pre-sputtering time is 300-1,200 s,
a deposition time is 1,000-6,000 s,
a calcination temperature is 200-550° C., and
a calcination time is 0.5-2 h.

* * * * *